United States Patent
Ieong et al.

(10) Patent No.: US 7,528,056 B2
(45) Date of Patent: May 5, 2009

(54) LOW-COST STRAINED SOI SUBSTRATE FOR HIGH-PERFORMANCE CMOS TECHNOLOGY

(75) Inventors: Meikei Ieong, Wappingers Falls, NY (US); Douglas C. La Tulipe, Jr., New Fairfield, CT (US); Leathen Shi, Yorktown Heights, NY (US); Anna W. Topol, Jefferson Valley, NY (US); James Vichiconti, Peekskill, NY (US); Albert M. Young, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/622,543

(22) Filed: Jan. 12, 2007

(65) Prior Publication Data

US 2008/0171423 A1    Jul. 17, 2008

(51) Int. Cl.
*H01L 21/36* (2006.01)
*H01L 21/20* (2006.01)

(52) U.S. Cl. .............. 438/486; 438/404; 438/479; 438/766; 257/347; 257/49; 257/65; 257/70; 257/75; 257/E21.297

(58) Field of Classification Search .......... 438/479, 438/486, 766, 404; 257/347, 49, 65, 70, 257/75, E21.297

See application file for complete search history.

(56) References Cited

U.S. PATENT DOCUMENTS

| | | | |
|---|---|---|---|
| 6,528,387 B1 * | 3/2003 | Moriyasu et al. ............ 438/404 |
| 6,534,380 B1 * | 3/2003 | Yamauchi et al. ........... 438/455 |
| 6,774,015 B1 * | 8/2004 | Cohen et al. ................ 438/479 |
| 7,265,004 B2 * | 9/2007 | Thean et al. ................ 438/151 |
| 2005/0095803 A1 * | 5/2005 | Bedell et al. ............... 438/407 |
| 2006/0125021 A1 * | 6/2006 | Bhattacharyya ............ 257/369 |
| 2006/0246638 A1 * | 11/2006 | Asami et al. ................ 438/150 |
| 2007/0032026 A1 * | 2/2007 | Ong et al. ................... 438/301 |
| 2007/0123010 A1 * | 5/2007 | Hoentschel et al. ......... 438/486 |

* cited by examiner

*Primary Examiner*—George Fourson
*Assistant Examiner*—John M Parker
(74) *Attorney, Agent, or Firm*—Scully, Scott, Murphy & Presser, P.C.; Ido Tuchman, Esq.

(57) ABSTRACT

A cost-effective and simple method of fabricating strained semiconductor-on-insulator (SSOI) structures which avoids epitaxial growth and subsequent wafer bonding processing steps is provided. In accordance with the present invention, a strain-memorization technique is used to create strained semiconductor regions on a SOI substrate. The transistors formed on the strained semiconductor regions have higher carrier mobility because the Si regions have been strained. The inventive method includes (i) ion implantation to create a thin amorphization layer, (ii) deposition of a high stress film on the amorphization layer, (iii) a thermal anneal to recrystallize the amorphization layer, and (iv) removal of the stress film. Because the SOI substrate was under stress during the recrystallization process, the final semiconductor layer will be under stress as well. The amount of stress and the polaity (tensile or compressive) of the stress can be controlled by the type and thickness of the stress films.

16 Claims, 3 Drawing Sheets

LOW-COST STRAINED SOI SUBSTRATE FOR HIGH-PERFORMANCE CMOS TECHNOLOGY

FIELD OF THE INVENTION

The present invention relates to semiconductor fabrication and more particularly to a method of fabricating a strained semiconductor-on-insulator (SSOI) substrate. The present invention also provides a method of fabricating devices atop the SSOI substrate.

BACKGROUND OF THE INVENTION

In the semiconductor industry, it is well known that device performance can be increased by introducing strain into a semiconductor channel of a metal oxide semiconductor field effect transistor (MOSFET). A strained semiconductor channel can be produced, for example, by depositing Si epitaxially on a relaxed SiGe material. The strain is created from the difference in lattice spacing between Si and SiGe.

Conventional strained Si typically uses a relatively thick (on the order of about 500 nm or greater) layer of SiGe to exert a strain on a top layer of relatively thin (on the order of about 20 nm or less) Si. The larger Ge atoms stretch or strain the top lattice of Si resulting in marked improvement of the transistors. However, the presence of the SiGe layer causes material and process integration challenges. The need to thin the active Si and SiGe layers for high-performance complementary metal oxide semiconductor (CMOS) technology makes the approach of building the transistors on top of a SiGe layer too difficult.

A strained semiconductor directly-on-insulator (SSDOI or just SSOI) structure bypasses the SiGe layer thereby providing higher device performance, while eliminating material and process integration problems.

In the prior art, a SSOI is typically fabricated by utilizing a layer transfer process. In such a process, an ultra-thin layer (on the order of about 30 nm or less) of Si is first formed epitaxially (i.e., layer by layer growth) on a relaxed SiGe layer. Next, an oxide layer is formed atop the ultra-thin layer of strained Si. After hydrogen is ion implanted into the SiGe layer, the wafer is flipped and bonded to a handle substrate. A high temperature (on the order of about 800° C. or greater) process splits away most of the original wafer, leaving the strained Si and SiGe layers on top of the oxide layer. Alternatively, a chemical surface activation method can be used to split the wafers at lower temperature (on the order of about 200° to about 400° C.). The SiGe layer is then completely removed and transistors are fabricated on the remaining ultra-thin strained Si.

The aforementioned prior art method of fabricating SSOI substrates is complicated and expensive since it involves epitaxial growth and a subsequent wafer bonding process. As such, a new and improved method of fabricating SSOI (or SSDOI) is needed that is cost-effective which eliminates the need for utilizing epitaxial growth and wafer bonding.

SUMMARY OF THE INVENTION

The present invention provides a cost-effect and simple method of fabricating a SSOI structure which avoids epitaxial growth and subsequent wafer bonding processing steps. In accordance with the present invention, a strain-memorization technique is used to create strained semiconductor regions on a SOI substrate. The transistors formed on the strained semiconductor regions have higher carrier mobility because the semiconductor regions have been strained.

The inventive method includes (i) ion implantation into a top semiconductor layer of an SOI substrate to create a thin amorphization layer, (ii) deposition of a high stress film on the amorphization layer, (iii) a thermal anneal to recrystallize the amorphization layer, and (iv) removal of the stress film. Because the SOI substrate was under stress during the recrystallization process, the final semiconductor device (i.e., the SOD layer will be under stress as well. The amount of stress and the polarity (tensile or compressive) of the stress can be controlled by the type and thickness of the stress films. The stress films employed in the present invention can be comprised of nitride, oxide, or other high stress dielectric materials.

In general terms, the method of the present invention comprises:

forming an amorphization layer on an upper surface of a top semiconductor layer of a semiconductor-on-insulator;

forming a high stress film on said amorphization layer;

performing a recrystallization anneal wherein said top semiconductor layer and said amorphization anneal are recrystallized into a strained semiconductor layer that has the same strain polarity as that of the stress film; and removing the stress film.

Localized stress regions can be created by using a sequence of repeated deposition and patterning process to create tensile and compressive strained semiconductor regions at selected areas. For optimized device performance, nFETs can be built on top of tensile strained semiconductor regions and pFETs can be built on top of compressive strained semiconductor regions.

DETAILED DESCRIPTION OF THE INVENTION

The present invention, which provides a method of fabricating a strained semiconductor-on-insulator (SSOI) substrate as well a method of fabricating devices atop the SSOI substrate, will now be described in greater detail by referring to the following discussion and drawings that accompany the present application. It is noted that the drawings of the present application are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with viable alternative process options without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
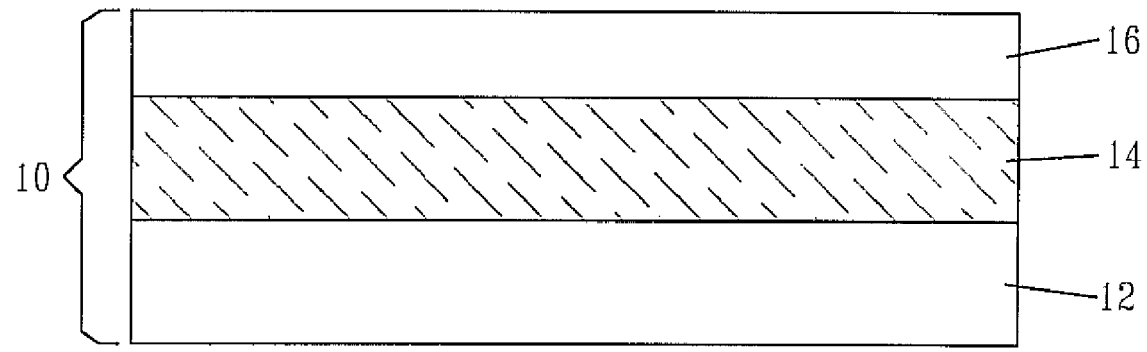
FIG. 1 is a pictorial representation (through a cross sectional view) illustrating an initial SOI substrate that can be employed in the present invention.

Reference is now made to FIG. 1 which illustrates an initial semiconductor-on-insulator (SOI) substrate 10 that is employed in the present application. The SOI substrate 10 includes a bottom semiconductor layer 12, a buried insulating layer 14 and a top semiconductor layer 16. The buried insulating layer 14, which comprises a crystalline or non-crystalline oxide or nitride, separates the top semiconductor layer 16 from the bottom semiconductor layer 12. Preferably, the buried insulating layer 14 is an oxide. The buried insulating layer 14 may be continuous (as shown) or it may be discontinuous. When a discontinuous buried insulating layer is present, the buried insulating layer exists as a discrete island that is surrounded by semiconducting material.

The top and bottom semiconductor layers 16 and 12, respectively, may comprise the same or different, preferably the same, semiconducting material. Suitable semiconducting materials that can be used as the top and bottom semiconductor layers of the SOI substrate 10 include, but are not limited to, Si, Ge, SiGe, SiC, SiGeC, Ga, GaAs, InAs, InP and all other III/V compound semiconductors. Typically, the top and bottom semiconductor layers of the SOI substrate 10 are Si-containing semiconducting materials, with Si being most preferred.

The semiconductor layers of the SOI substrate 10 may have a single crystal orientation or they may be comprised of different crystal orientations. In yet another embodiment of the present invention, the top semiconductor layer 16 has regions of different crystal orientation which allows for fabricating a FET upon a specific crystal orientation that enhances the performance of the FET. For example, a 'hybrid' SOI substrate can be formed which allows for providing a structure in which a pFET can be formed on a (110) crystal orientation, while an nFET can be formed on a (100) crystal orientation.

The SOI substrates may be formed utilizing standard processing including, for example, a separation by ion implantation of oxygen (SIMOX) process or by a layer transfer process. Hybrid SOI substrates can be formed utilizing techniques that are also well known to those skilled in the art.

The thickness of the top semiconductor layer 16 of the SOI substrate 10 is from about 10 to about 150 nm, with a thickness from about 50 to about 100 nm being even more typical. If the top semiconductor layer 16 of the SOI substrate 10 is not within the above range after processing, a thinning step such as etching can be used to provide a top semiconductor layer 16 having the thickness mentioned above. The buried insulating layer 14 of the SOI substrate 10 has a thickness from about 25 to about 300 nM, with a thickness from about 50 to about 100 nm being even more typical. The thickness of the bottom semiconductor layer 12 of the SOI substrate 10 is inconsequential to the present application.

Figure 6:
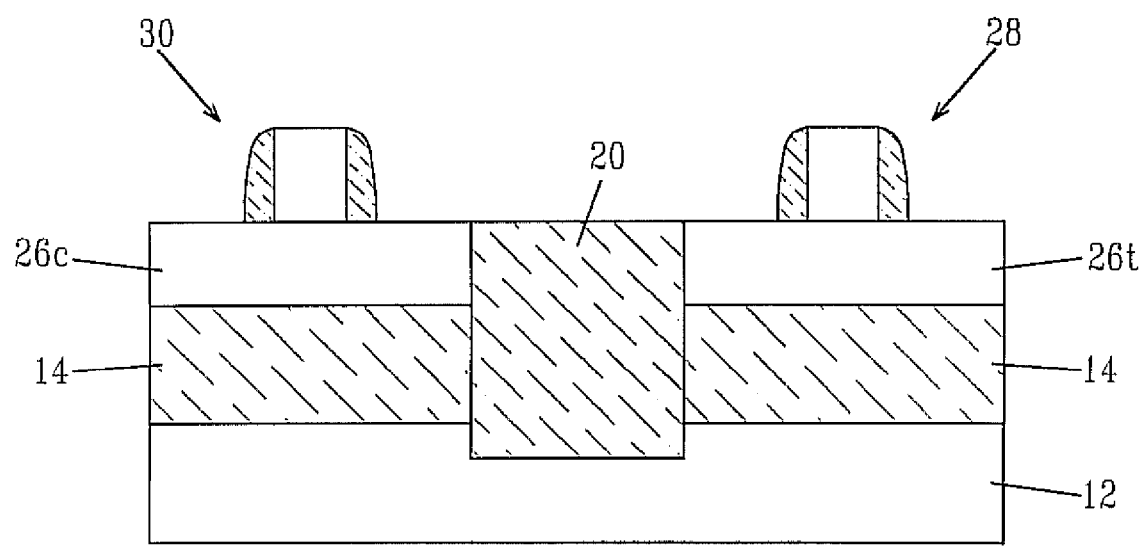
FIG. 6 is a pictorial representation (through a cross sectional view) illustrating the structure of FIG. 5 after forming a pFET on the compressive strained region, and an nFET on the tensile strained region.

At this point of the present invention a trench isolation region (not shown in FIG. 1) can be formed into the SOI substrate 10 utilizing conventional techniques that are well known to those skilled in the art. For example, a trench isolation region can be formed by lithography, etching and trench fill with a trench dielectric such as an oxide. A planarization process such as chemical mechanical polishing can follow the trench fill step. FIGS. 6 and 7 show an embodiment in which a trench isolation region 20 is present.

Figure 2:
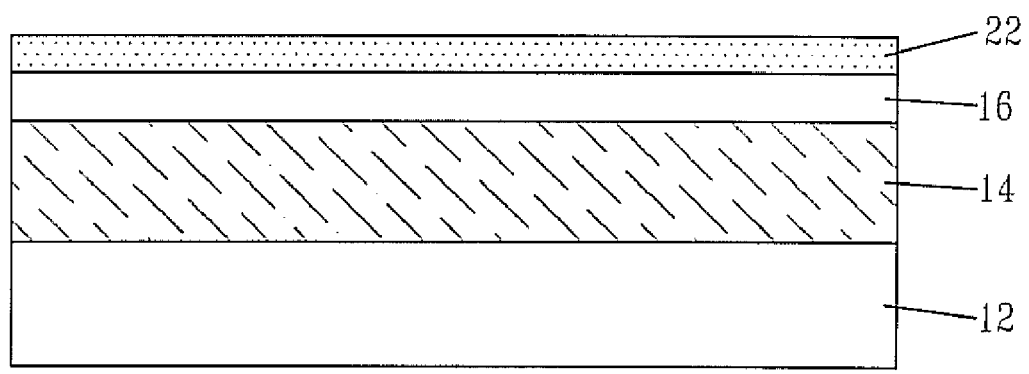
FIG. 2 is a pictorial representation (through a cross sectional view) illustrating the structure of FIG. 1 after creating an amorphized layer at the upper surface of the SOI substrate.

Next, an amorphization layer 22 is formed at the surface of the SOI substrate, i.e., at the surface of the top semiconductor layer 16, providing the structure shown, for example, in FIG. 2. The amorphization layer 22 is formed by ion implantation of at least one ion from Group IV of the Periodic Table of Elements into the SOI substrate 10. Examples of Group IV ions that can be used in creating the amorphization layer 22 include, for example, Si, Ge, C or any combinations thereof. The amorphization layer 22 extends from the upper surface of the top semiconductor layer 16 of the SOI substrate 10 down to a depth that is from about 5 to about 50 nm below the upper surface.

As indicated above, the amorphization layer 22 is formed by ion implantation of at least one ion from Group IV of the Periodic Table of Elements into the top semiconductor layer 16 of the SOI substrate 10. Typical conditions for the ion implantation that are used in creating the amorphization layer 22 include an ion dose from about 5E14 to about 5E15 atoms/cm$^3$ and an energy from about 5 to about 50 keV. Other ion implantation conditions can also be used provided that the other conditions create an amorphization layer 22 as described above.

In some embodiments of the present application (not shown), an oxide can be formed atop the top semiconductor layer 16 prior to performing the ion implantation. The oxide can be formed by a thermal oxidation process or a conventional deposition process such as, for example, chemical vapor deposition (CVD), plasma assisted chemical vapor deposition (PECVD), atomic layer deposition (ALD) and chemical solution deposition can be used in forming the oxide. When an oxide is present atop the top semiconductor layer 16 of the SOI substrate 10, the oxide typically has a thickness from about 2 to about 100 nm, with a thickness from about 5 to about 20 nm being even more typical.

The oxide layer that is formed may remain in the structure after forming the amorphization layer 22, or it can be removed totally or in part from the structure after forming the amorphization layer 22. A conventional stripping process can be used to totally remove the oxide from the structure. When the oxide is partially removed, a block mask is formed over the oxide layer to remain in the structure, and thereafter a conventional stripping process is used to remove the oxide not protected by the block mask. The block mask is then removed from the structure utilizing conventional means well known to those skilled in the art.

Figure 3:
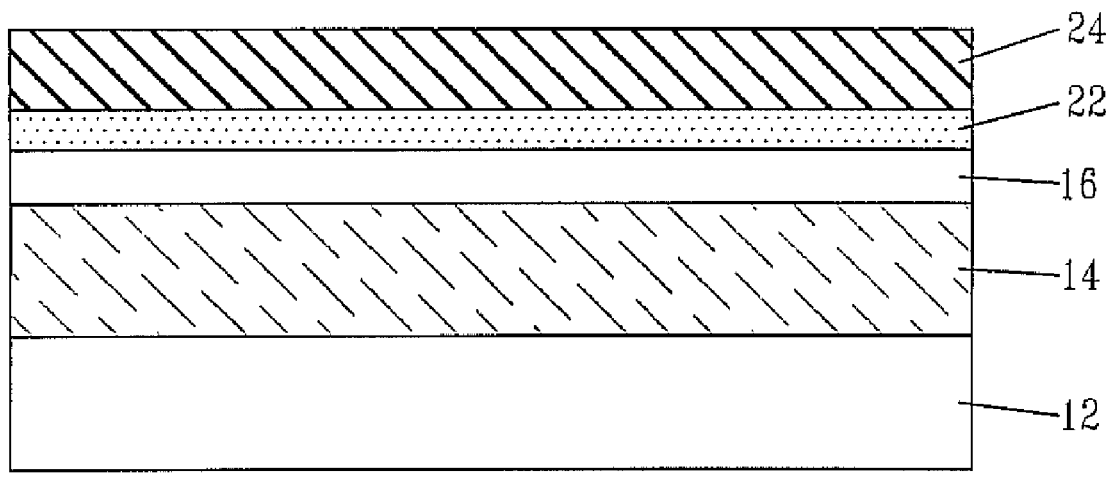
FIG. 3 is a pictorial representation (through a cross sectional view) illustrating the structure of FIG. 2 after the deposition of a high stress film.

After at least forming the amorphization layer 22 on the upper surface of the SOI substrate 10, at least one high stress film 24 is formed on the exposed upper surface of the amorphization layer 22. Such a structure including the high stress film 24 is shown for example, in FIG. 3. By "high stress film"

it is meant a film that has a stress value of about 500 MPa or greater. The at least one high stress film 24 may comprise any stress inducing material such as, for example, a nitride, a high density oxide, or any combination thereof. Typically, the at least one high stress film 24 is a nitride.

The high stress film 24 can be formed by various chemical vapor deposition (CVD) processes such as, for example, low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a modern metalorganic precursor for CBD applications. The later provides a low temperature nitride film having high stress. The high stress film 24 can be under tensile stress (typically when an nFET is to be subsequently formed) or compressive stress (typically when a pFET is to be subsequently formed).

The thickness of the stress film 24 may vary depending on the type of stress film deposited as well as the deposition process that is used in forming the same. Typically, the stress film 24 has a thickness from about 10 to about 500 nm, with a thickness from about 20 to about 200 nm being even more typical.

In some embodiments of the present invention, it is possible to form a tensile stress film on some areas of the amorphized layer 22, while forming a compressive stress film on other areas of the amorphized layer 22. Such a structure is formed utilizing block masks and the above-mentioned deposition of the various stressed films.

Figure 4:
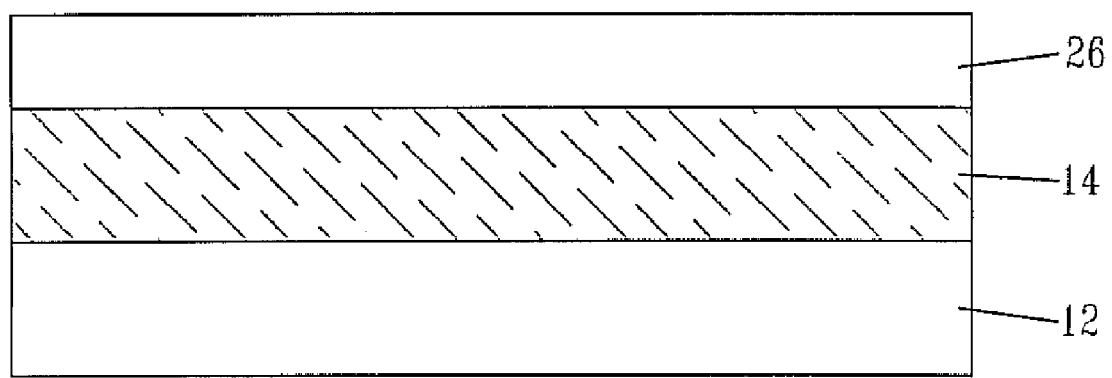
FIG. 4 is a pictorial representation (through a cross sectional view) illustrating the structure of FIG. 3 after performing a recrystallization anneal and removal of the stress film.

Reference is now made to FIG. 4 which shows the structure that is formed after performing a high temperature anneal and removal of the stress film 24. In FIG. 4, reference numeral 26 denotes a strained semiconductor layer that is formed atop the buried insulating layer 14. In accordance with the present invention, the strained semiconductor layer 26 has the same stress value and polarity as that of the stress film 24.

The high temperature anneal that is employed in the present invention is an annealing step that is capable of recrystallizing the amorphized layer 22. The high temperature (or recrystallization) anneal is typically performed at a temperature from about 600° to about 1000° C., with a temperature from about 650° to about 700° C. being even more typical. The anneal is typically performed in an inert ambient such as, for example, He, Ar, Ne, or mixtures thereof. The duration of the recrystallization anneal may vary depending on the thickness of the amorphization layer 22 and the temperature of the anneal itself. Typically, the duration of the recrystallization anneal is from about 1 to about 60 minutes, with a duration of about 30 minutes being even more typical.

Because the recrystallization process is under high stress from the overlying high stress film 24, the top semiconductor layer 16 including the amorphization layer 22 are recrystallized into a highly strained semiconductor layer 26.

The high stress film 24 is then removed utilizing a conventional stripping process, including etching and/or chemical mechanical polishing, providing the structure shown in FIG. 4.

Figure 5:
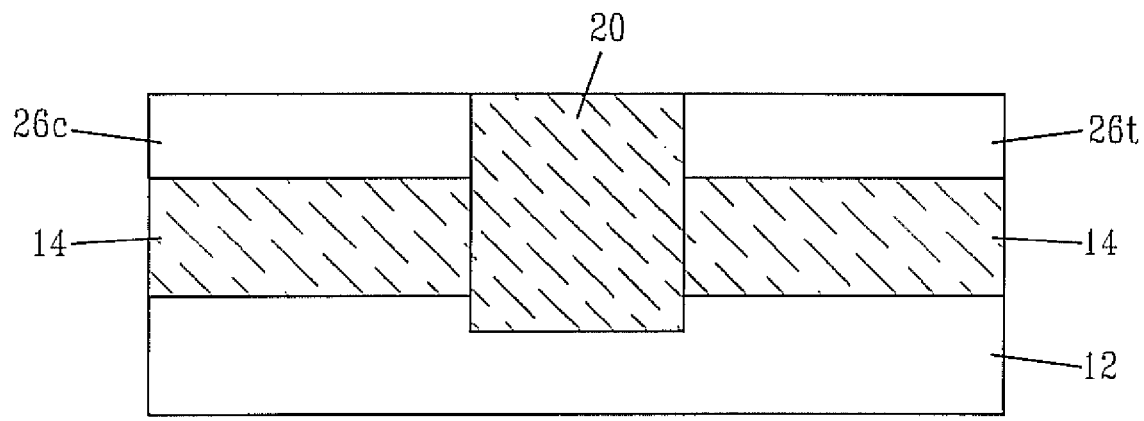
FIG. 5 is a pictorial representation (through a cross sectional view) illustrating a strained SOI substrate that can be formed utilizing the inventive method; in the illustrated embodiment the strained SOI substrate includes a region of compressive strain and a region of tensile strain that are separated by an isolation region.

FIG. 5 shows an embodiment in which a tensile stress film was formed on some areas of the amorphized layer 22 and a compressive stress film was formed on other areas of the amorphized layer 22 after the amorphization anneal and removal of the 'dual' stress layers. In FIG. 5, reference numeral 26c represents a semiconductor material that is under compressive strain, while reference numeral 26t denotes a semiconductor material under tensile strain.

Next, at least one complementary metal oxide semiconductor (CMOS) device such as, for example, a field effect transistor (FET) is formed on an active area of the strained semiconductor layer 26. The polarity of the FET formed is dependent upon whether the highly strained semiconductor layer 26 is under compressive or tensile strain. When the strained semiconductor layer 26 is under compressive strain, a pFET is formed thereon. When the strained semiconductor layer 26 is under tensile strain, an NFET is formed. FIG. 6 shows the structure of FIG. 5 after forming an NFET 28 on the tensile stained region and a pFET 30 on the compressive strained region.

Each FET that is present is formed utilizing a conventional CMOS process. One method includes the steps of forming a layered stack comprising a gate dielectric and a gate conductor on the strained semiconductor layer 26. The gate dielectric can be formed by a thermal process such as oxidation or by a conventional deposition process such as chemical vapor deposition (CVD), plasma enhanced CVD, evaporation, atomic layer deposition and other like deposition processes. The gate conductor is formed by a deposition process such as CVD, PECVD, sputtering, plating, evaporation, atomic layer deposition and the like. When polySi or SiGe gates are used, the conductive material can be doped in-situ or following deposition by ion implantation. Implantation masks and ion implantations are used to form the FETs of different conductivities. Following the formation of the layered stack, at least the gate conductor (and optionally the gate dielectric) is patterned by lithography and etching. A thermal process can then be used to form a passivation layer. Thereafter, S/D extensions are formed by ion implantation and annealing. Sidewalls spacers are then formed by deposition and etching and thereafter the S/D regions are formed by ion implantation and annealing. The annealing step used for activating the S/D extension can be omitted and activation can occur during the activation of the S/D regions.

Another process of forming a FET includes a replacement gate process. The replacement gate process provides a means for providing a FET that has a very short channel length (on the order of 0.5 microns or less). The replacement gate process including forming a dummy gate region on the strained semiconductor layer, forming a planarizing dielectric on said strained semiconductor layer including said dummy gate region, planarizing the structure to expose an upper portion of the dummy gate region, removing the dummy gate region, forming spacers on exposed sidewalls of the planarizing dielectric and thereafter forming a gate dielectric and a gate conductor.

The materials of the gate dielectric, gate conductor and spacer are conventional and are well known to those skilled in the art. For example, the gate dielectric may be an oxide, nitride, oxynitride or combinations and multilayers thereof. The gate conductor may comprise doped polySi, doped SiGe, an elemental metal, an alloy including at least one elemental metal, a metal silicide, a metal nitride or multilayers thereof. A diffusion barrier may optionally be present separating multilayered conductive stacks. The spacer is comprised of an insulating oxide, nitride or oxynitride.

While the above embodiment depicts a case in which the stress film 24 is formed atop of the SOI substrate, the present invention also contemplates cases where the stress film is formed beneath the SOI substrate or where stress films are formed atop and below the SOI substrate. The location of the strained silicon layers can be modified by adjusting the implant energy and dose during the ion implantation step during the creation of the amorphization layer step.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for fabricating a strained semiconductor-on-insulator comprising:
   forming an amorphization layer on an upper surface of a top semiconductor layer of an semiconductor-on-insulator;
   forming a high stress film on said amorphization layer, wherein said forming said high stress film comprises deposition of a first strain polarity material onto selected areas of the amorphization layer and deposition of a second strain polarity material onto other areas of the amorphization layer, wherein said first strain polarity is different from said second strain polarity;
   performing a recrystallization anneal wherein said top semiconductor layer and said amorphization layer are recrystallized into a strained semiconductor layer that has the same strain polarity as that of the stress film; and
   removing the stress film.

2. The method of claim 1 wherein said forming the amorphization layer comprises ion implantation of at least one ion selected from Group IV of the Periodic Table of Elements.

3. The method of claim 2 wherein said Group IV ions comprise Si, Ge, C or any combination thereof.

4. The method of claim 2 wherein said ion implantation is performed using an ion dose from about 5E14 to about 5E15 atoms/cm$^3$ and an energy from about 5 to about 50 keV.

5. The method of claim 1 further comprising forming an oxide layer on said top semiconductor layer prior to forming said amorphization layer.

6. The method of claim 1 wherein said forming said high stress film comprises low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a metalorganic precursor.

7. The method of claim 1 wherein said anneal is performed at a temperature from about 600° to about 1000° C.

8. A method for fabricating a CMOS device on a strained semiconductor-on-insulator comprising:
   forming an amorphization layer on an upper surface of a top semiconductor layer of an semiconductor-on-insulator;
   forming a high stress film on said amorphization layer, wherein said forming said high stress film comprises deposition of a first strain polarity material onto selected areas of the amorphization layer and deposition of a second strain polarity material onto other areas of the amorphization layer, wherein said first strain polarity is different from said second strain polarity;
   performing a recrystallization anneal wherein said top semiconductor layer and said amorphization layer are recrystallized into a strained semiconductor layer that has the same strain polarity as that of the stress film;
   removing the stress film; and
   forming at least one CMOS device on said strained semiconductor layer.

9. The method of claim 8 wherein said forming the amorphization layer comprises ion implantation of at least one ion selected from Group IV of the Periodic Table of Elements.

10. The method of claim 9 wherein said Group IV ions comprise Si, Ge, C or any combination thereof.

11. The method of claim 9 wherein said ion implantation is performed using an ion dose from about 5E14 to about 5E15 atoms/cm$^3$ and an energy from about 5 to about 50 keV.

12. The method of claim 8 further comprising forming an oxide layer on said top semiconductor layer prior to forming said amorphization layer.

13. The method of claim 8 wherein said forming said high stress film comprises low pressure CVD (LPCVD), plasma enhanced CVD (PECVD), rapid thermal CVD (RTCVD) or BTBAS-based ($C_8H_{22}N_2Si$ reacted with ammonia) CVD, where BTBAS is a metalorganic precursor.

14. The method of claim 8 wherein said anneal is performed at a temperature from about 600° to about 1000° C.

15. The method of claim 8 wherein said first stress polarity is compressive and said second stress polarity is tensile.

16. The method of claim 15 wherein an nFET is formed on the tensile stressed region and a pFET is formed in the compressive stressed region.

* * * * *